United States Patent [19]

Graham et al.

[11] Patent Number: 5,349,608

[45] Date of Patent: Sep. 20, 1994

[54] VITERBI ACS UNIT WITH RENORMALIZATION

[75] Inventors: Hatch Graham, Fremont; Christine Nguyen, Milpitas, both of Calif.

[73] Assignee: Stanford Telecommunications, Inc., Santa Clara, Calif.

[21] Appl. No.: 38,323

[22] Filed: Mar. 29, 1993

[51] Int. Cl.$^5$ .......................................... H04L 27/06
[52] U.S. Cl. ...................... 375/94; 375/17; 375/42; 371/43
[58] Field of Search .............. 375/17, 34, 94, 39; 371/37.7, 43; 329/331

[56] References Cited

U.S. PATENT DOCUMENTS

| | | | |
|---|---|---|---|
| 4,606,027 | 8/1986 | Otani | 371/43 |
| 4,763,328 | 8/1988 | Shimoda et al. | 371/43 |
| 4,905,317 | 2/1990 | Suzuki et al. | 371/43 |
| 5,027,374 | 6/1991 | Rossman | 375/94 |

OTHER PUBLICATIONS

Fettweis, et al., "High-Rate Viterbi Processor: A Systolic Array Solution," IEEE Journal of Sel. Areas in Comm., vol. 8, No. 8, Oct. 1990, pp. 1520-1534.

Fettweis, et al., "A 100Mbit/s Viterbi Decoder Chip: Novel Architecture and its Realization," ICC'90, Paper No. 257, Session 307.4, Atlanta, Ga., Apr. 16-19, 1990, pp. 1-5.

Gulak, et al., "VLSI Structures for Viterbi Receivers: Part I–General Theory and Applications," IEEE J. on Sel. Areas in Comm., vol. SAC-4, No. 1, Jan. 1986, pp. 142-154.

Frenette, et al., "Implementation of a Viterbi Processor for a Digital Communications System with a Time-Dispersive Channel," IEEE J. on Sel. Areas of Comm., vol. SAC-4, No. 1, Jan. 1986, pp. 160-167.

*Primary Examiner*—Stephen Chin
*Assistant Examiner*—Tse Young
*Attorney, Agent, or Firm*—Townsend and Townsend Khourie and Crew

[57] ABSTRACT

In a Viterbi decoder including an add-compare-select (ACS) processor, speed is enhanced without loss of performance by maintaining a dynamic cumulative metric range for computed state metrics. Current state metrics are added to new branch metrics to obtain two computed metrics, and the smaller of the two computed metrics is stored along with previously computed state metrics. The stored state metrics are compared with a selected scale factor, for example one-half maximum scale factor, and all current state metrics are rescaled when the minimum stored metric value exceeds the selected scale factor.

3 Claims, 4 Drawing Sheets

VITERBI ACS UNIT WITH RENORMALIZATION

BACKGROUND OF THE INVENTION

This invention relates generally to signal decoders for decoding sequence codes such as the Viterbi algorithm decoder, and more particularly the invention relates to the add-compare-select (ACS) function processor in such decoders and the renormalization or rescaling of calculated path metrics in the ACS processor.

Convolutional encoding and Viterbi decoding are used to provide forward error correction in transmitted digital data and thus improve digital communication performance over a noisy transmission link. The convolutional encoder establishes a code tree relationship between input and output sequences. Each branch of the tree represents a single input symbol. Any input sequence traces out a specific path through the tree. Another way of viewing the code tree is the trellis diagram. The Viterbi algorithm attempts to find a path through the trellis using the maximum likelihood decision. The two paths entering each node of a trellis are compared, and the path with the best metric (minimum error) is selected. The other path is rejected since its likelihood can never exceed that of the selected path regardless of the subsequent received data. Thus, at any given time, there is only one path with the best metric entering into each current node of the trellis.

FIG. 1 is a block diagram of a Viterbi decoder and includes a branch metric unit (BMU) to calculate transition metrics λ which are then accumulated recursively as path metrics in the add-compare-select (ACSU). The survivor trace unit (STU) processes the decisions made in the ACSU and TMU and gives out the decoded data. A high-speed Viterbi decoder implementation requires high-speed solutions for all three units. Since the TMU and SMU are of simple feed forward structure, parallel processing architectures are easily derived. However, the ASCU contains the nonlinear ACS-recursion which represents a bottleneck.

In most Viterbi designs, the ACS processor contains the most critical path which determines the speed of the decoder. Each ACS element includes two adders, a comparator, and a storage element. The two adders are used to add the values of the current state metrics to the new branch metrics for the upper and lower branches. The comparator then evaluates the results of the two adders and selects the smaller of the two metrics. The selected metric is then stored in a storage element as the next state metrics. The complexity of this circuit is linearly proportional to the number of bits used to represent the path metrics. The value of any path metric is limited.

Thus, a minimum effective cumulative metric range must be provided between the largest metric and the smallest metric. The present invention is directed to efficiently maintaining the effective cumulative metric range by renormalizing calculated path metrics in a timely manner and thereby increasing data rate throughput.

SUMMARY OF THE INVENTION

In accordance with the invention, an ACS processor in a Viterbi or sequence code decoder includes renormalization to rescale all path metrics when the minimum metric value exceeds a predetermined threshold. Thus, a minimum effective cumulative metric range is ensured between the largest metric and the smallest metric.

In accomplishing the renormalization, pipelining is utilized to weigh the metric values in one bit cycle and renormalize the metric values as necessary in the succeeding bit cycle. Increased data rate and throughput are realized in the two cycle operation.

In one embodiment in which the cumulative path metrics are 6 bits wide (64 levels of quantization), renormalization is done by subtracting "32" when the smallest metric is greater than "31". By using the threshold value of "32" minimum hardware and time are required to perform the subtraction, and a dynamic cumulative metric range of 31 units provides an adequate value.

The invention and objects and features thereof will be more readily apparent from the following detailed description and dependent claims when taken with the drawings.

DESCRIPTION OF SPECIFIC EMBODIMENTS

To better understand the add-compare-select (ACS) processor in accordance with the invention, a brief summary of the Viterbi algorithm (VA) is given. The Viterbi algorithm is further described by Fettweis, et al., in "High Rate Viterbi Processor: A Systolic Array Solution," *IEEE Journal on Selected Areas in Communication*, Vol. 8, No. 8, Oct., 1990, pages 1520–1534.

Underlying the algorithm is a discrete-time Markov chain with a finite number of N states $s_i$. At time $(k+1)T$, a transition takes place from the state at time $kT$ to the new state at time $(k+1)T$. The transition probabilities depend on the state at time k, but are independent of the previous history of the process (Markov property). The transition dynamics can be described by a trellis, illustrated in FIG. 2, for an example with $N=4$ states. To simplify the notation, it is assumed that $T=1$ and the transition probabilities are time invariant.

The VA recursively estimates the path the Markov process has taken through the trellis (sequence estimation). At each new time instant k and for every state, the VA calculates the optimum path, which leads to that state, and discards all other paths already at time k as nonoptimal. This is accomplished by summing a probability measure called the path metric $\gamma_{i,k}$ for each state $s_i$ at every time instant k. At the next time instant $k+1$, depending on the newly observed transition, a transition metric $\lambda_{ij,k}$ is calculated for all possible transition branches from state $s_j$ to state $s_i$($s_j \rightarrow s_i$) of the trellis.

The algorithm for obtaining the updated $\gamma_{i,k+1}$ is called the ACS recursion of the VA (ACS: add-compare-select) and can be described in the following way. For each state and all its preceding states $s_j$, choose that path as optimum according to the following decision:

$$\text{for all } s_j; \gamma_{i,k+1} = \text{maximum } (\lambda_{ij,k} + \gamma_{j,k}). \quad (1)$$
$$\text{(all possible } s_j \to s_i)$$

Figure 2:
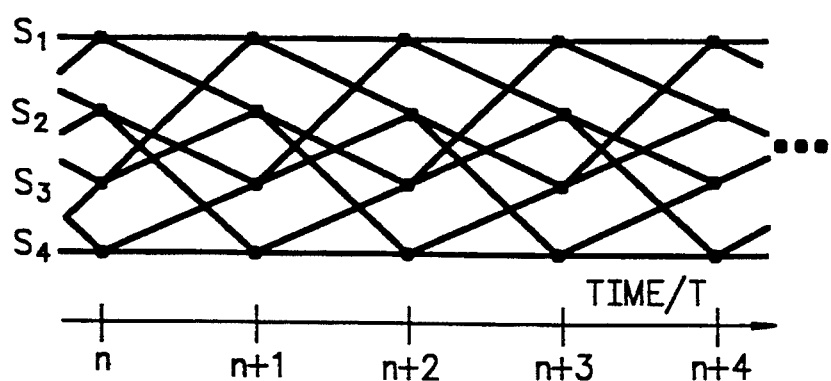
FIG. 2 is an example of a four-state trellis in decoding a Viterbi algorithm.

For the N=4 state trellis of FIG. 2, this leads to the following set of N equations called the ACS recursion:

$$\begin{aligned}
\gamma_{1,k+1} &: \max (\lambda_{11,k} + \gamma_{1,k}; \lambda_{13,k} + \gamma_{3,k}) \\
\gamma_{2,k+1} &: \max (\lambda_{21,k} + \gamma_{1,k}; \lambda_{23,k} + \gamma_{3,k}) \\
\gamma_{3,k+1} &: \max (\lambda_{32,k} + \gamma_{2,k}; \lambda_{34,k} + \gamma_{4,k}) \\
\gamma_{4,k+1} &: \max (\lambda_{42,k} + \gamma_{2,k}; \lambda_{44,k} + \gamma_{4,k})
\end{aligned} \quad (2)$$

The surviving path to each state has to be updated for each state and has to be stored in an additional memory, called the survivor memory. For a sufficiently large number of observed transitions (survivor depth D), it is highly probable that all N paths merge when they are traced back. Hence the number D of transitions which have to be stored as the path leading to each state is finite, which allows the estimated transition of time instant k-D to be determined.

Figure 1:
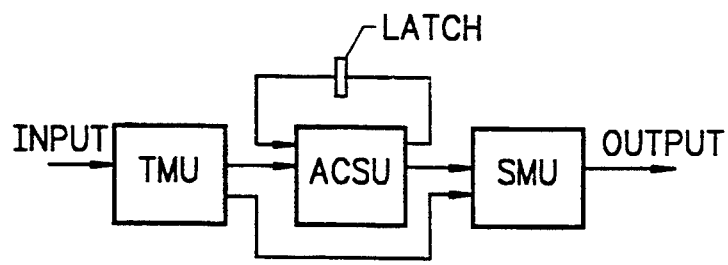
FIG. 1 is a functional block diagram of a Viterbi decoder.

An implementation of the VA, referred to as the Viterbi processor (VP), can be divided into the three basic units as shown in FIG. 1. The input data are used in the transition metric unit (TMU) to calculate the transition metrics $\lambda_{ij}$, which then are accumulated recursively as path metrics $\gamma_i$ in the add-compare-select unit (ACSU). The survivor memory unit (SMU) processes the decisions made in the TMU and ACSU and outputs the estimated data.

The ACS contains the most critical path which determines the speed of the decoder. A critical aspect in the ACS is rescaling of all path metrics so that the full scale range of the ACS processor is not exceeded.

Figure 3:
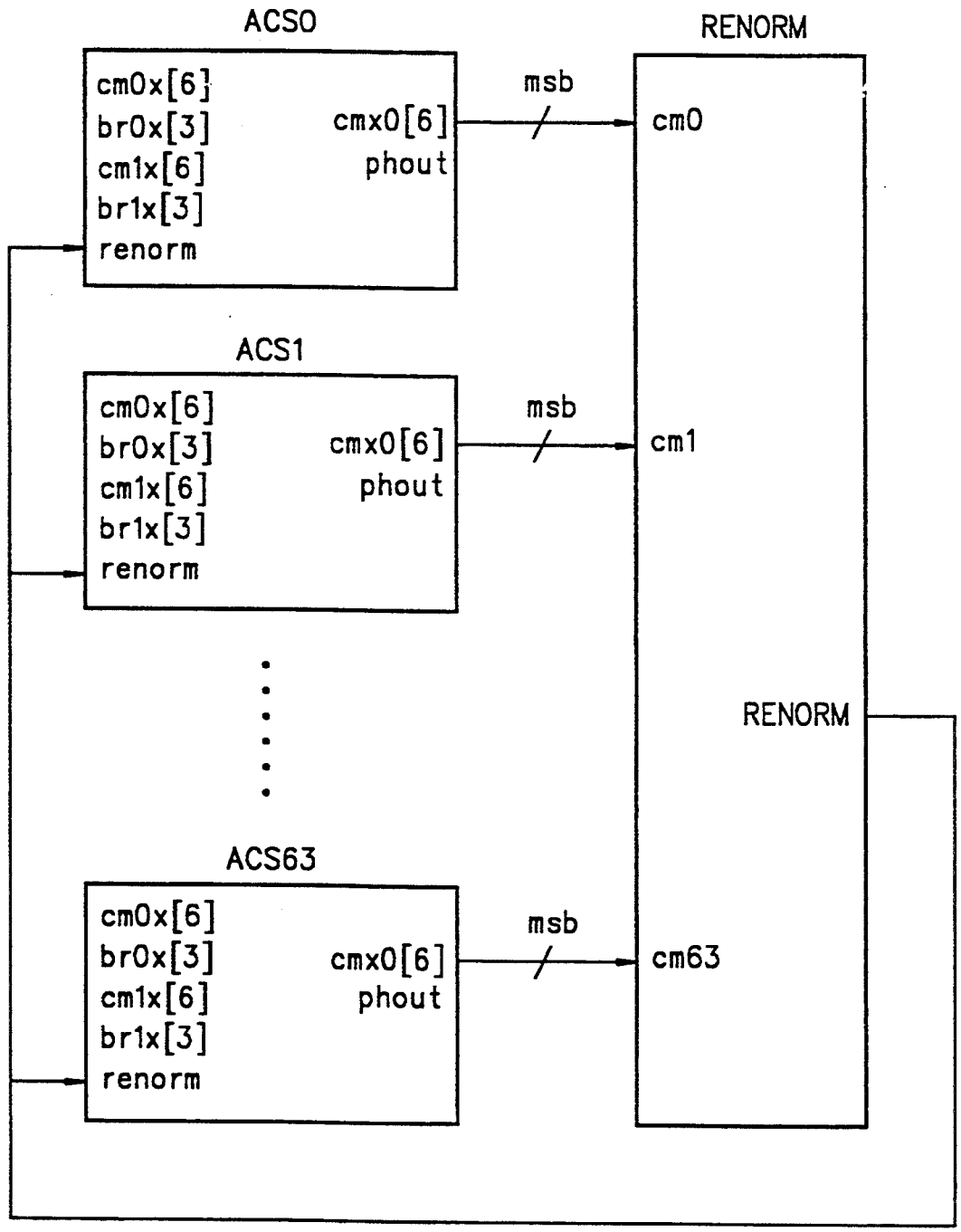
FIG. 3 is a block diagram of an add-compare-select (ACS) processor in accordance with the invention.
Figure 4:
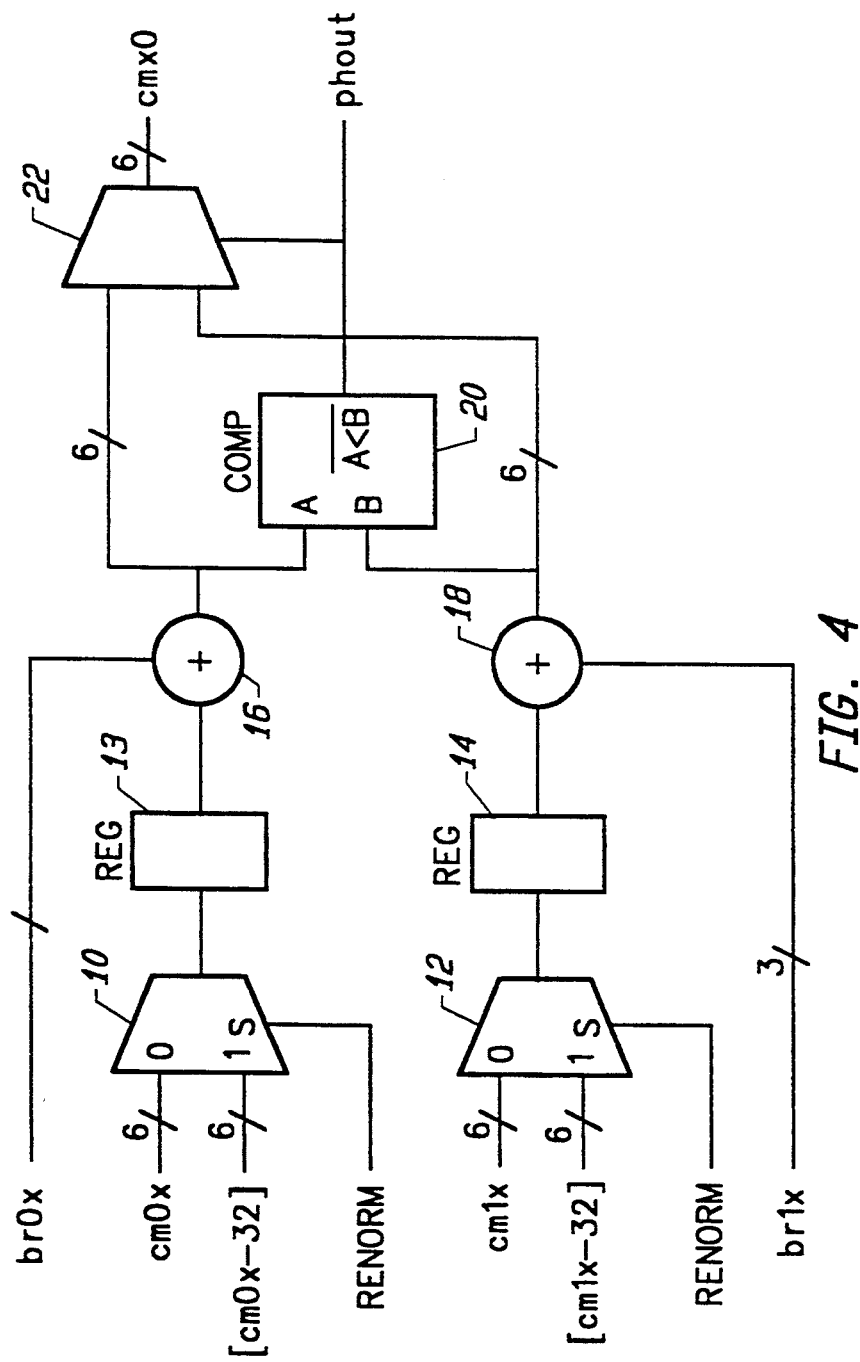
FIG. 4 is a functional block diagram of an ACS unit in the processor of FIG. 3.

FIG. 3 is a functional block diagram of an ACS processor in accordance with one embodiment of the invention which uses 64 ACS elements in parallel at a maximum speed of 45 MHz to update the path metrics. Each ACS element operates As shown in FIG. 4, the current metrics value (cm0x) and a decimated value (cm0x−32) are applied to multiplexer 10, and the current metrics value (cm1x) and a decimated value (cm1x−32) are applied to multiplexer 12. The current values are selected as outputs except when a renormalization signal is applied to the multiplexers. The multiplexer outputs are applied through registers 13, 14 to adders 16, 18 which add the current metrics values to the branch metrics values (br0x, br1x). Comparator 20 and multiplexer 22 then select the lesser cumulative metrics value of adders 16, 18 as the output of multiplexer 22, which is applied to a register 50 in FIG. 5. Thus, the two adders are used to add the values of the current state metrics to the new incoming branch metrics for the upper and lower branches at a node. The comparator then evaluates results of the two adders and selects the smaller of the two metrics. The selected metric is then stored in a storage element as the next state metrics. The complexity of this circuit is linearly proportional to the number of bits used to represent the path metrics. In the illustrated embodiment, a 3-bit soft decision input data (8 levels of quantization) with non-uniform metric assignment is provided to give 3-bit branch metrics. The cumulative path metrics are 6 bits wide whereby the value of any path metric is limited to the value "63" when it exceeds the 6-bit range.

In accordance with the invention, renormalization is utilized to rescale all of the path metrics when the minimum metric value exceeds a predetermined threshold. The purpose of this function is to ensure a minimum effective cumulative metric range between the largest metric and the smallest metric. In the illustrative embodiment, renormalization is done by subtracting the value "32" when the smallest metric is greater than "31". The threshold of "32" is chosen because it takes minimum hardware and time to perform the subtraction and also that value will give a dynamic cumulative metric range of 31 units, which has been shown through simulations to be an adequate value.

Figure 5:
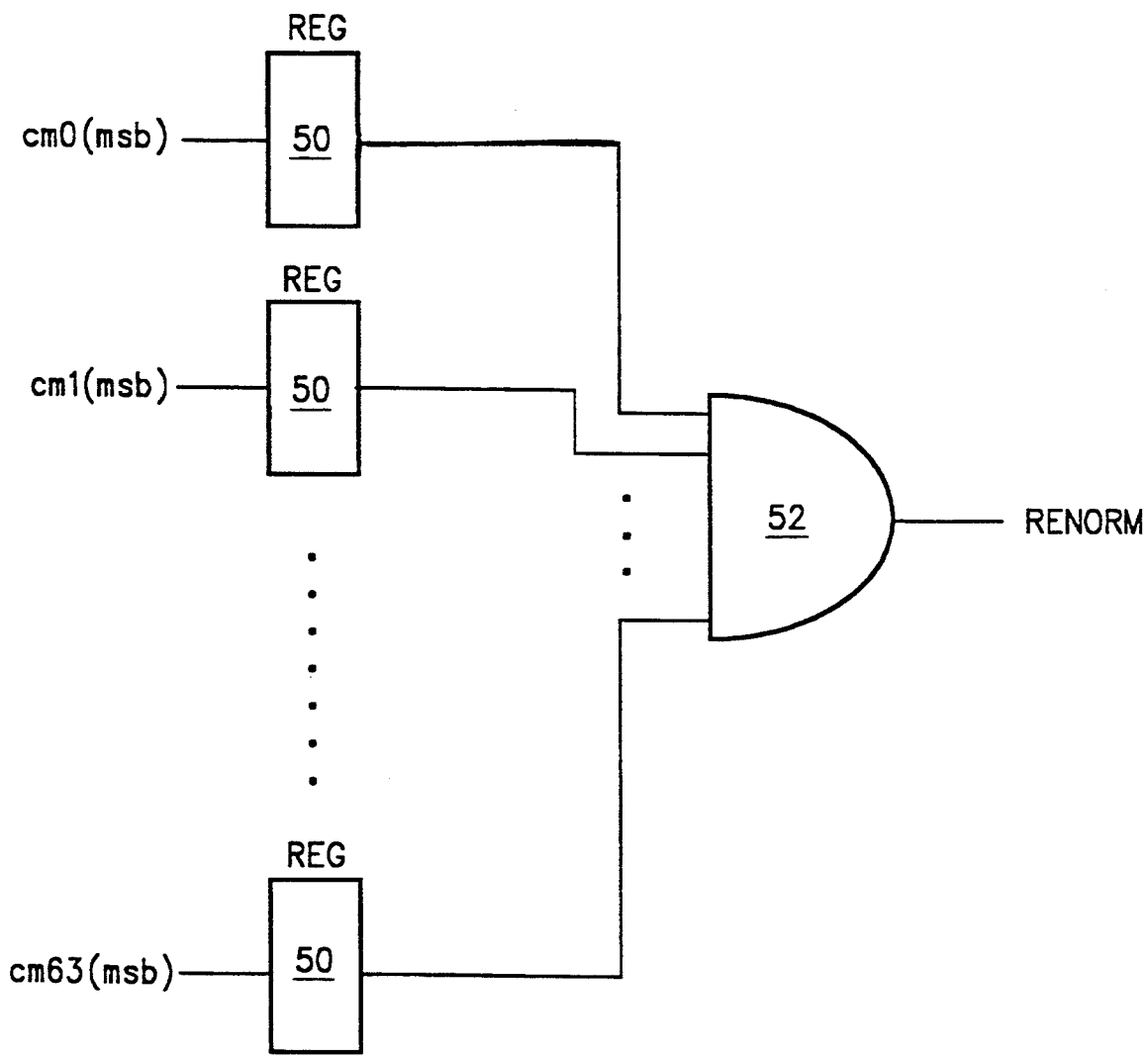
FIG. 5 is a functional block diagram of renormalization circuitry in the processor of FIG. 3.

The process of monitoring all 64 metric values until the smallest value exceeds the threshold takes many levels of logic which, if added to the add-compare-select function, makes it near impossible to perform all the functions in one bit time, i.e., 1 45 MHz clock cycle. Thus, the renormalization process is delayed until the next bit time. In other words, once all the 64 path metrics have been computed, the subtraction takes place the following clock cycle if all metrics have exceeded the threshold. This is illustrated in the schematic of FIG. 5 in which calculated path metrics are stored in registers 50 during one clock cycle and then renormalized during the next cycle when all cumulative path matrix of all blocks exceeds 31, as determined by the AND gate function 52. Each register provides an output to the AND gate 52 when the value stored in the register exceeds 31. The lifo cycle operation reduces circuit complexity and increases data throughput.

The ACS processor, in accordance with the present invention, provides a simple yet powerful rescaling of metric values. The ACS processor improves speed without any loss in performance since the dynamic cumulative metric range is not changed.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An add-compare-select (ACS) processor for use in Viterbi decoding of convolutional codes comprising a plurality of ACS elements, each element including
   first and second adders to add values of current state metrics to new branch metrics for an upper and a lower branch, a comparator coupled to said adders for selecting the smaller of two metrics, and a storage element for storing the selected metric; and
   renormalization means for comparing stored metrics with a selected scale factor in one clock cycle, and rescaling all stored metrics when the minimum stored metric value exceeds said selected scale factor in the following clock cycle.

2. The add-compare-select (ACS) processor as defined by claim 1 wherein said processor includes 64 ACS elements with the cumulative path metrics being 6 bits wide, the maximum scale factor being 63 and said renormalization means rescaling all stored metrics when the minimum stored metric value exceeds a selected scale factor of 31.

3. In a Viterbi decoder using an add-compare-select processor for determining minimum path metrics, a method of maintaining dynamic cumulative metric range including the steps of adding current state metrics to new branch metrics for upper and lower branches to obtain two computed metrics, selecting the smaller of said two computed metrics, storing said smaller of said two metrics along with other current state metrics, comparing said current state metrics with a selected scale factor during one clock cycle, and rescaling said current state metrics when the minimum stored metric value exceeds said selected scale factor in the following clock cycle.

* * * * *